United States Patent [19]
Pink et al.

[11] Patent Number: 5,532,927
[45] Date of Patent: Jul. 2, 1996

[54] AUTOMOTIVE DIAGNOSTIC TOOL

[75] Inventors: David Pink; Christopher Marley, both of Daventry, Great Britain

[73] Assignee: V. L. Churchill, Ltd., United Kingdom

[21] Appl. No.: 988,110

[22] PCT Filed: Jul. 25, 1991

[86] PCT No.: PCT/GB91/01246

§ 371 Date: Sep. 2, 1993

§ 102(e) Date: Sep. 2, 1993

[87] PCT Pub. No.: WO92/02825

PCT Pub. Date: Feb. 20, 1992

[30] Foreign Application Priority Data

Jul. 27, 1990 [GB] United Kingdom .................. 9016533

[51] Int. Cl.⁶ .......................... G06F 19/00; G01R 31/00; G01M 17/00
[52] U.S. Cl. ................. 364/424.03; 364/551.01; 73/117.3
[58] Field of Search ............. 364/551.01, 424.03, 364/424.04, 483; 73/117.2, 117.3

[56] References Cited

U.S. PATENT DOCUMENTS

| | | | |
|---|---|---|---|
| 4,375,672 | 3/1983 | Kato et al. ........................ | 364/551.01 |
| 4,690,475 | 9/1987 | McElroy ................................ | 439/502 |
| 4,694,408 | 9/1987 | Zaleski ............................. | 364/551.01 |
| 4,757,463 | 7/1988 | Ballou et al. ...................... | 364/551.01 |
| 4,814,693 | 3/1989 | Coben ...................................... | 324/66 |
| 4,831,560 | 5/1989 | Zaleski ............................. | 364/551.01 |
| 5,005,129 | 4/1991 | Abe et al. .......................... | 364/424.03 |
| 5,172,062 | 12/1992 | Eisermann ............................. | 324/503 |
| 5,177,447 | 1/1993 | Marino et al. ......................... | 324/713 |
| 5,214,582 | 5/1993 | Gray .................................... | 364/424.03 |
| 5,272,769 | 12/1993 | Strnatka et al. ....................... | 395/161 |

Primary Examiner—Michael Zanelli
Attorney, Agent, or Firm—Frijouf, Rust & Pyle

[57] ABSTRACT

An apparatus (16) for diagnosing faults in the electrical circuit of a motor vehicle which has a microprocessor (90) connected to a wiring harness (10) of a vehicle for controlling selected operations of the vehicle as a diagnostic microprocessor (22) which is coupled to the vehicle microprocessor (90) and wiring harness (10) by way of a multipin connector (14) and either an autotest circuit (44) or a manual breakout box (42) and reference probe (18). The microprocessor (22) also has a further test probe (20) for connection to the various terminals in the wiring harness (10). A plugin module (28) stores information particular to the vehicle and the test and the diagnostic microprocessor (22) monitors the vehicle microprocessor (90) and interprets any fault signals received from this using the information in the plugin module (28) to carry out a diagnostic test of the vehicle wiring harness (10) to locate the fault. The diagnostic test may include user interface through a display (24) and a keypad (30) which allows user input in response to selected displays generated on the display (24) by the microprocessor (22).

17 Claims, 4 Drawing Sheets

AUTOMOTIVE DIAGNOSTIC TOOL

The present invention relates to Automotive Diagnostic equipment for use in identifying faults in motor vehicle electrics.

BACKGROUND OF THE INVENTION

Most modern automotive vehicles have one or more on board computers which control, for example, fuel injection and ignition. Each computer runs a self checking test which also checks the vehicle electrics. If a fault is found then a fault code signal is generated. Under normal circumstances, a mechanic would then have to look up this number in a vehicle manual which would provide him with various possible options for the type of fault. Because this tends to be a time consuming task mechanics tend not to do this and simply go through the vehicle changing various instrument sensors until they find the faulty sensor. However, more often than not, the fault lies in the wiring harness of the vehicle with a break in a cable.

SUMMARY OF THE INVENTION

Accordingly, the present invention provides an apparatus for diagnosing faults in the electrical system of a motor vehicle, comprising a first connector for connection to a selected output terminal of a computer of the vehicle, a second connector for connection to a terminal in the electrical system of the vehicle, a micro processor having respective inputs coupled to said connectors, display means coupled to said microprocessor, and storage means for storing preselected information, and wherein said microprocessor is operable to receive a fault signal from said vehicle computer and display on said display means fault testing data in dependence on said fault signal from said vehicle computer and the information stored in said storage means.

Advantageously, the microprocessor is operable to apply a test signal between said connectors for testing the continuity of the vehicle wiring between said connectors, and is operable to generate a display on said display means in dependence thereon.

The present invention also provides a method of diagnosing faults in the electrical system of a motor vehicle, comprising monitoring a fault signal generated by a computer of said vehicle, interpreting said fault signal as a function of preselected parameters specific to said vehicle, generating a fault diagnosis display in dependence on said fault signal, applying a test signal to a selected portion of the circuit of said vehicle electrical system for monitoring the continuity thereof and adjusting said fault diagnosis display in dependence thereon.

BRIEF DESCRIPTION OF THE DRAWINGS

The present invention is further described hereinafter, by way of example, with reference to the accompanying drawings, in which.

DETAILED DESCRIPTION

Figure 1:
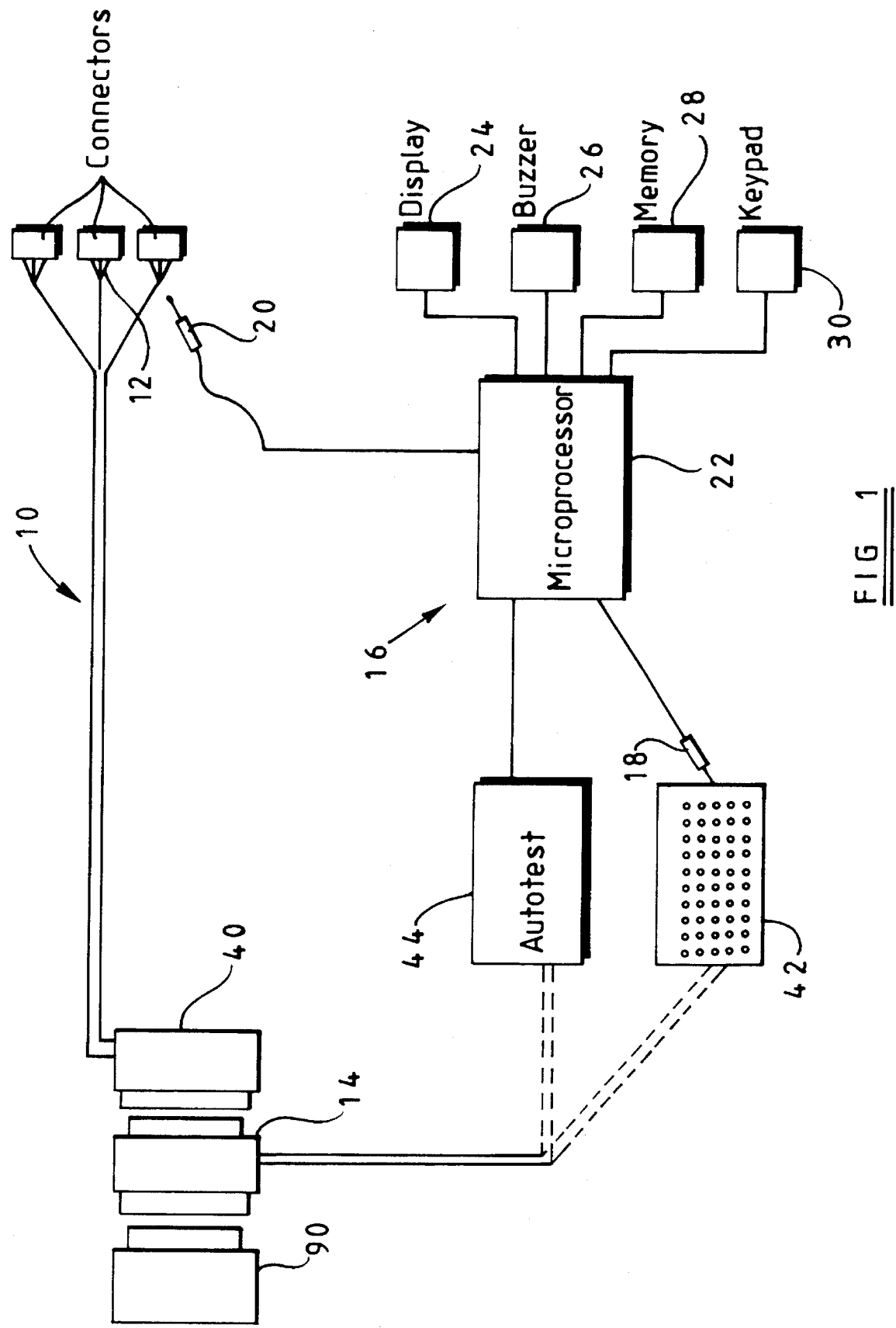
FIG. 1 is a block circuit diagram of a preferred apparatus according to the present invention together with a vehicle wiring harness.

Referring firstly to FIG. 1, this shows a preferred automotive diagnostic apparatus 16 with part of a vehicle wiring harness 10 connecting an on board vehicle computer 90 through various connectors 12 to other parts of the wiring harness. The harness 10 is connected to the computer by way of a pin connector 40 which may be a 60 pin connector.

An adaptor or "T" connector 14 is connected between the on board computer 90 and the 60 pin connector of the wiring harness. This enables the diagnostic apparatus 16 to be connected into the wiring harness whilst retaining the harness connected to the computer.

The diagnostic apparatus 16 may be provided with either a breakout box means 42 or an autotest 44 through which a microprocessor 22 can be connected to the "T" adaptor 14. The autotest 44 enables the microprocessor 22 to connect itself to any one of the pins on the "T" connector.

The diagnostic apparatus is also provided with a reference plug or probe 18 which can be connected to any one of the available 60 sockets in the "T" adaptor by plugging into the corresponding socket in the manual breakout box means 42. A test probe 20 is also provided for probing any of the cables or pins in the remote connectors 12. The reference probe and test probe are coupled through respective inputs to the microprocessor 22. A display unit 24 which is conveniently an LCD display unit is also coupled to the microprocessor together with a buzzer 26 or other audio indicator and a memory module 28. The memory module is a pre-programmed detachable module which contains pre-programmed data applicable to the particular vehicle on test. The module is one of a number of interchangeable modules for various types of vehicles. A keypad 30 coupled to the microprocessor 22 allows information to be entered by the user.

Figure 2:
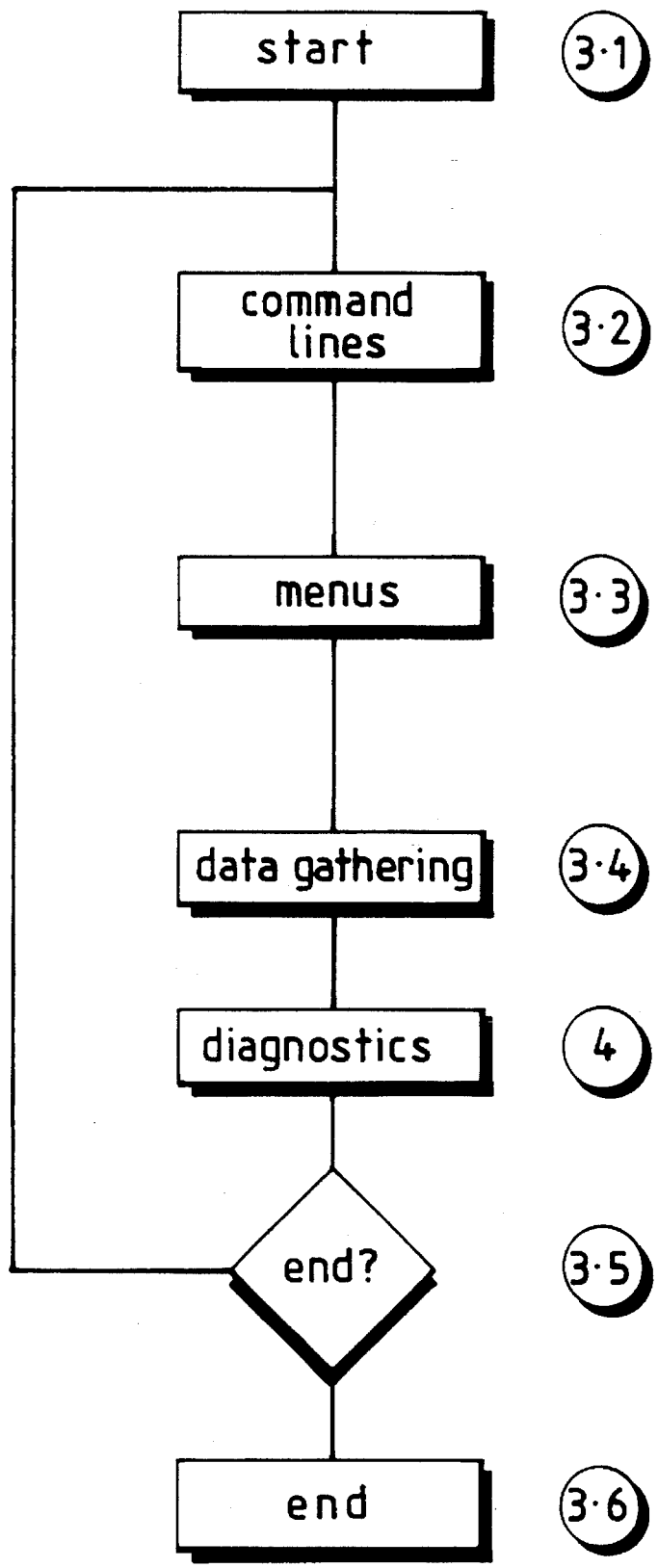
FIG. 2, 3 and 4 are flow diagrams showing the operation of the apparatus.

FIG. 2 is a flow chart showing the steps of the main programme carried out by the microprocessor 22. The apparatus 16 is first connected to the on board computer of the vehicle through the "T" connector 14 and reads from the memory module 28 the set of operating parameters for the particular vehicle or vehicle type to be tested (3.2). The user then selects the vehicle from a list of similar type vehicles on a menu (3.3) following which the apparatus interrogates the vehicle computer to detect any fault signals generated by the computer (3.4). If a fault signal is detected, the signal is interpreted by the microprocessor 22 using the information stored in the memory module 28 and the microprocessor then carries out a diagnostic routine of one or more selected tests in order to locate the vehicle fault (4.0). If no fault signal is detected then the programme is terminated.

Figure 3:
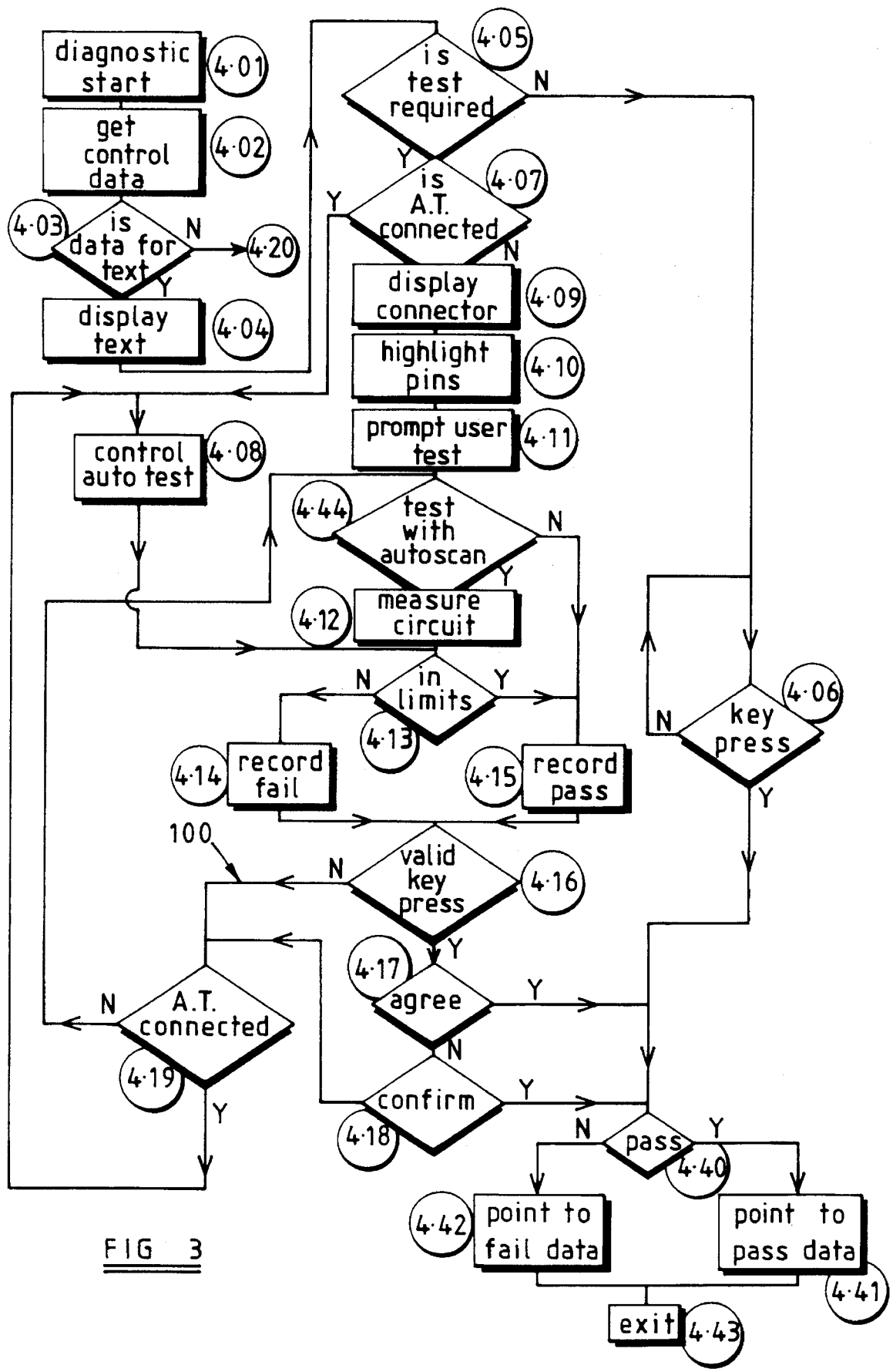
Figure 4:
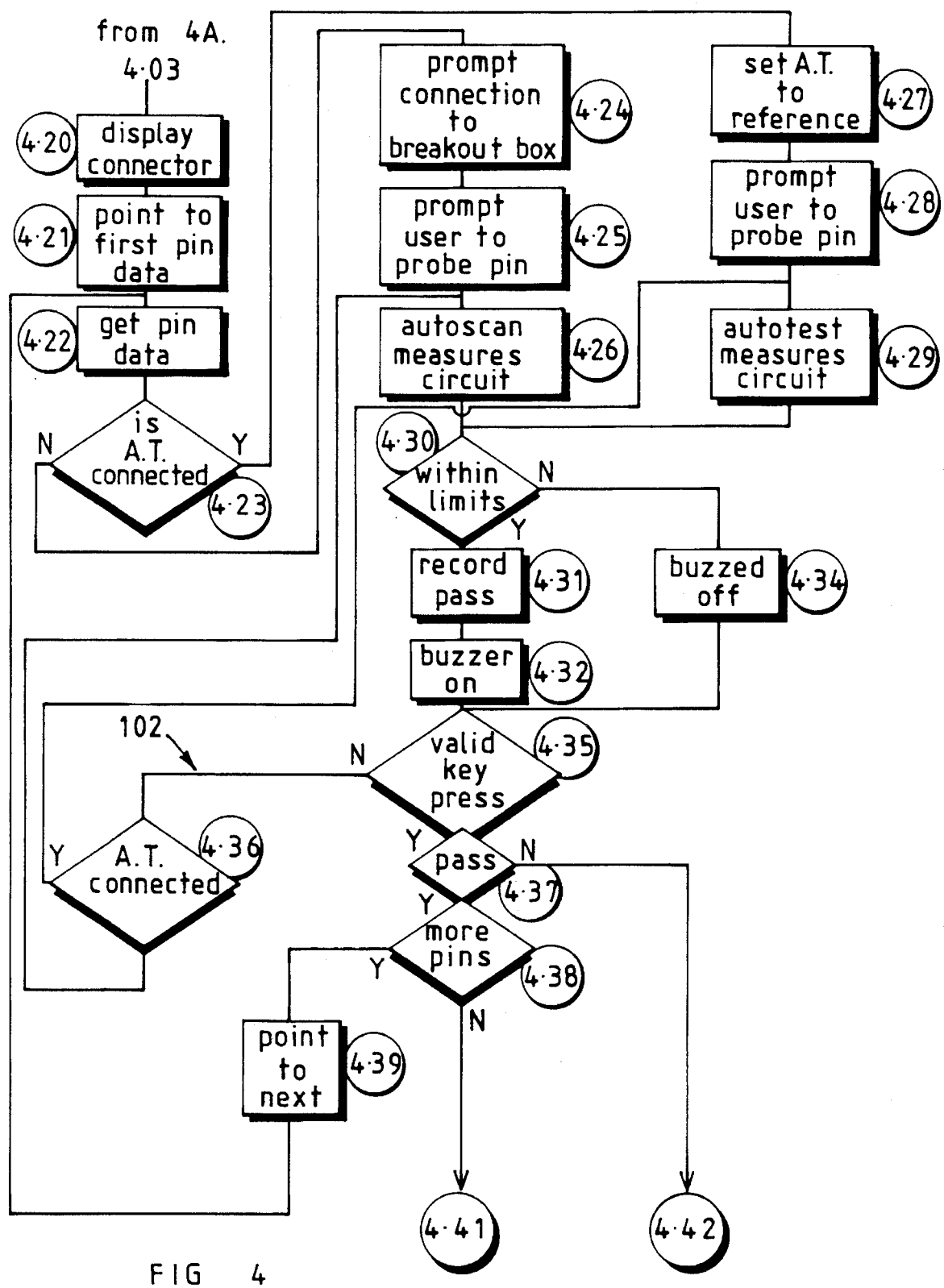

If a fault is detected then the apparatus 16 carries out a diagnostic check following the steps shown in FIGS. 3 and 4.

Referring firstly to FIG. 3, data is read from the module 28 in dependence on the diagnostic routine chosen following interpretation of the fault signal (4.02). If the data is text only, i.e. asking a question of the user then the text is displayed on the display unit 24 (4.04). If this merely requests the answer to a question such as is the throttle fully open or are the lights on (4.05) then no test is required and the programme automatically proceeds directly to a user key entry (4.06) and waits for the user to enter a YES/NO or PASS/FAIL answer on the keypad 30. Once a valid key entry has been made the programme then evaluates whether or not the "test" is a PASS or FAIL and in this particular case automatically logs the "test" as a PASS (4.40). The programme then exits back to the main programme (FIG. 2) for the next test to be initiated or the programme to be terminated.

If the text displayed on the display unit 24 (4.04) requires the user to carry out a test measurement then the microprocessor 22 first checks to see whether the autotest unit 44 or the manual breakout box means 42 is connected to the microprocessor (4.07). If the autotest unit 44 is connected then the microprocessor controls the autotest unit 44 to connect the microprocessor to the relevant pin on the "T" adaptor 14 (4.08) and takes the required measurement (duty cycle, pulse time, voltage or the like). In this event the probe 20 is not required.

If the autotest unit 44 is not connected and the user has to use the breakout box means 42 the microprocessor 22 displays the drawing of the box 42 and the two pins in the break out box from which the measurements are to be taken (4.09, 4.10) using the two probes 18, 20. The user is then prompted (4.11) by text on the display unit 24 to connect the probes 18 and 20 respectively to the pins on the break out box 42.

If the microprocessor 22 can carry out the required test, for example the measurement of voltage or frequency, it will do so. If, however, it is not capable of carrying out the test, for example measurement of current, it prompts the user to carry out the test using an external multimeter or equivalent (4.44). If an external test is effected by the user then this is automatically recorded by the microprocessor 22 as a PASS (4.15).

Where the microprocessor 22 carries out the test it measures the relevant parameters (4.12) and compares these with the stored data in the module 28, displaying the resulting readings on the display unit 24 (4.13). If the readings are within the preset parameter limits then a PASS is recorded (4.15) otherwise a FAIL is recorded (4.14).

Regardless of whether the measurements are effected through the autotest 44 or the breakout box means 42 and also regardless of whether or not a PASS or FAIL is logged the microprocessor then waits for the user to enter a valid key entry on the keypad (4.16). This allows the user to override the PASS/FAIL signal if desired. If no valid key entry is made then the test is repeated through the loop 100.

If a valid key entry is detected then the system checks to see if the test PASS or FAIL signal generated by the microprocessor agrees with the user key entry (4.17). If they do not agree then the user is asked to confirm the key entry (4.18). If the key entry is not confirmed then a retest is carried out through loop 100. If the key entry is confirmed then the microprocessor checks to see if the user input is a PASS or FAIL (4.40) and exits to the main programme for the next test to be carried out or the programme to be terminated.

If the data read from the module 28 (4.03) by the microprocessor is graphical i.e. indicating that a continuity test between the "T" connector and a remote connector is to effected then a pictorial representation of the remote connector 12 in question is shown on the display unit 24 (4.20) and the first pin of the remote connector 12 to be tested is also identified (4.21) on the display unit (FIG. 4). The relevant data in the memory store for comparison with the measured data is then selected (4.22). If the autotest 44 is connected then the relevant pin of the "T" adaptor 14 is connected through the autotest 44 to the microprocessor 22 (4.27) and the user is prompted to connect the test probe 20 to the displayed pin of the remote connector 12 (4.28), following which a continuity check is effected (4.29) by the microprocessor. The result of the test is then compared with the stored data to see whether or not it falls within the specified limits (4.30). If the autotest 44 is not connected then in addition to being prompted to connect the test probe 20 to the displayed pin of the remote connector 12 the user is also prompted to connect the reference probe 18 to the relevant pin in the breakout box 42 by use of the display on the display unit 24 (4.24, 4.25), following which the continuity check is effected by the microprocessor 22 and the result again compared with the stored data to see whether or not it falls within the specified limits.

If the result of the test does fall within the specified limits then a PASS is recorded (4.31) and the buzzer 26 is switched on (4.32) until either the test probe 20 or reference probe 18 is removed. If the measurement is outside the limits then the buzzer is not activated (4.34).

The microprocessor then waits for a valid key entry on the keypad 30 (4.35). If a valid key entry is not detected then the test is repeated through loop 102. If a valid key entry is detected then the microprocessor 22 continues in dependence on the test being a PASS or FAIL (4.37). If it is a FAIL then the programme exits to the main programme (4.42) for the next diagnostic test to be carried out. If it is a PASS then the microprocessor checks to see if there are any more pins in the remote connector 12 to be tested. If there are then the next pin is selected (4.39) otherwise the programme exits to the main programme again.

The diagnostic apparatus may also be used to locate intermittent faults which are only evident when the vehicle is in operation, for example when physical movement of a cable or sensor during running of the vehicle breaks the continuity of a circuit. This is effected by the microprocessor 22 which can be set to repeat a particular test over a period of time.

Referring to FIG. 3, as is described above, where a test measurement is required (4.05) the microprocessor 22 checks to see if the autotest unit 44 is connected (4.07). If the autotest unit 44 is connected then the microprocessor checks to see if the intermittent fault check has been set on the microprocessor. The autotest unit 44 is then controlled to carry out the required measurement (4.08). The result of the measurement is then compared with the stored limits (4.13) as described above. If the intermittent fault check has been initiated then the measurement is repeatedly taken until the intermittent fault check is discontinued.

The above-described apparatus allows the vehicle to be tested both in its static and running conditions. This enables the system to locate intermittent faults which are only evident when the vehicle is in operation, for example, when physical movement of a cable or sensor during running of the vehicle breaks a circuit.

The apparatus thus monitors any change in the state of the wiring under test. For example, the apparatus monitors the resistance of a circuit when the vehicle electrics are in a static (off) condition, and also "edge-detection" (digital change either positive or negative going) and/or voltage change outside a predetermined range when the vehicle electrics are on and the vehicle is running.

The fault information monitored by the apparatus can be stored in a memory of the microprocessor 22 for retrieval at a later time.

The apparatus 16 has an RS 232 port which enables the apparatus to be connected to a display terminal or mini computer and/or other such apparatus. This is particularly useful where a vehicle has several on board computers in various locations. A separate apparatus can then be connected to each computer and to a master computer.

What is claimed is:

1. A method of diagnosing fault in an electrical circuit of a motor vehicle having a microprocessor connected to a wiring harness of the vehicle for controlling selected operations of the vehicle, the method using a diagnostic apparatus having:

a diagnostic microprocessor, connector means for connection between said vehicle microprocessor and said wiring harness for connecting said diagnostic microprocessor to said electrical circuit, said connector means selectively connecting one of an autotest unit and a manual breakout box and with reference probe means for connecting said diagnostic microprocessor to said manual breakout box:

store means for storing data including control data representative of selected parameters specific to said electrical circuit;

test probe means for connecting said diagnostic microprocessor to selected locations in said electrical circuit;

display means for displaying user information; and keypad means for enabling user input to said diagnostic microprocessor;

the method comprising:

(a) monitoring signals from said vehicle microprocessor to detect fault signals;

(b) selecting control data from said stored data representative of preselected parameters specific to said electrical circuit in response to receipt of a fault signal; and (c) commencing a preselected diagnostic check of said electrical circuit;

wherein said preselected diagnostic check comprises carrying out one of the following steps in dependence on said control data:

(c1) where said control data is text only, generating a fault diagnostic display on said display means in the form of text and awaiting a user key entry on said keypad; or (c2) where said control data requires the user to carry out a test measurement, monitoring said connector means for the presence of one of said autotest unit and said manual breakout box and prompting the user by a display on said display means in response to said diagnostic microprocessor detecting the presence of said manual breakout box.

2. A method according to claim 1 wherein said test measurement is a continuity test between said connector means and a selected terminal of a selected connector of the electrical circuit;

and the step (c2) comprises:

(d1a) in response to a detection of an autotest unit, prompting a user to connect said test probe to the selected terminal of said selected connector:

(d1b) in response to the presence of a manual breakout box, prompting a user to connect said test probe to the selected terminal of said selected connector and prompting the user to connect said reference probe to a selected terminal in said breakout box means; and (d1c) monitoring the continuity of said electrical circuit between said connector means and said test probe and generating a response signal in dependence on said continuity.

3. A method according to claim 2 further comprising (e) comparing said response signal with said selected parameters and generating a PASS/FAIL signal in dependence on said comparison.

4. A method according to claim 3 further comprising (f) monitoring said keypad means for a preselected user key entry and repeating steps (d2) and (e) in the absence thereof.

5. A method according to claim 3 further comprising (f) monitoring said keypad means for a preselected user key entry and repeating steps (d1 to (f) for subsequent terminals of said selected connector in response to said user key entry validating a PASS signal.

6. A method according to claim 1 wherein step (c1) comprises (g) commencing a second preselected diagnostic check in dependence on said key entry.

7. A method according to claim 1 wherein step (c2) comprises (i) selecting at least one terminal of said connector means in dependence on said control data and monitoring a preselected parameter of said electrical circuit at said at least one select terminal.

8. A method according to claim 7 wherein said step (i) comprises selecting two terminals of said connector means in dependence on said control data and monitoring a preselected parameter of said electrical circuit across said two selected terminals.

9. A method according to claim 7 wherein said preselected parameter is one of the duty cycle, pulse width, frequency and voltage of a signal at said selected terminal.

10. A method according to claim 7 further comprising repeating step (i) a preselected number of times.

11. A method according to claim 7 wherein in response to the presence of a manual breakout box the method further comprises, prior to step (i), the step of (h) generating a display indicating two terminals on said breakout box from which measurements are to be taken and prompting the user to connect said reference and test probes to said terminals.

12. A method according to claim 11 further comprising (k) monitoring said keypad means for a preselected user key entry and repeating step (i) or repeating steps (h) and (i) in the absence thereof.

13. A method according to claim 11 wherein said preselected diagnostic check comprises the step of (l) generating a display on said display means requesting the user to confirm said key entry in response to said key entry not confirming said PASS/FAIL signal, monitoring said keypad means for a further preselected user key entry and repeating steps (i) or steps (h) and (i) in response to the lack of confirmation.

14. A method according to claim 7 further comprising (j) comparing said monitored said preselected parameter with a reference value from said control data and generating a PASS/FAIL signal in response thereto.

15. A method according to claim 11 further comprising (k) monitoring said keypad means for a preselected user key entry, comparing said key entry with said PASS/FAIL signal and carrying out a preselected operation in dependence on said comparison.

16. A method according to claim 15 wherein said preselected operation comprises the step of (l) generating a display on said display means requesting the user to confirm said key entry in response to said key entry not confirming said PASS/FAIL signal, monitoring said keypad means for a further preselected user key entry and terminating said preselected diagnostic check in response to said further preselected user key entry confirming said first mentioned user key entry.

17. An apparatus for diagnosing faults in an electrical circuit of a motor vehicle having a microprocessor connected to a wiring harness of the vehicle for controlling selected operations of the vehicle, the apparatus comprising:

a diagnostic microprocessor;

connector means for connection between said vehicle microprocessor and said wiring harness for connecting said diagnostic microprocessor to said electrical circuit, said connector means selectively connecting one of an autotest unit and a manual breakout box and reference probe means for connecting said diagnostic microprocessor to said manual breakout box;

store means for storing data representative of selected parameters specific to said electrical circuit;

test probe means for connecting said diagnostic microprocessor to selected locations in said electrical circuit;

display means for displaying user information; and keypad means for enabling user input to said diagnostic microprocessor.

* * * * *